US008227099B2

(12) United States Patent
Dieny et al.

(10) Patent No.: US 8,227,099 B2
(45) Date of Patent: Jul. 24, 2012

(54) RADIO-FREQUENCY OSCILLATOR WITH SPIN-POLARISED CURRENT

(75) Inventors: Bernard Dieny, Lans en Vercors (FR); Alina-Maria Deac-Renner, Cluj-Napoca (RO)

(73) Assignees: Commissariat a l'Energie Atomique, Paris (FR); Centre National de la Recherche Scientifique, Paris (FR)

( * ) Notice: Subject to any disclaimer, the term of this patent is extended or adjusted under 35 U.S.C. 154(b) by 412 days.

(21) Appl. No.: 12/107,954

(22) Filed: Apr. 23, 2008

(65) Prior Publication Data

US 2008/0241597 A1 Oct. 2, 2008

Related U.S. Application Data

(63) Continuation of application No. PCT/IB2006/054692, filed on Oct. 31, 2006.

(30) Foreign Application Priority Data

Nov. 2, 2005 (FR) ...................................... 05 53321

(51) Int. Cl.
*G11B 5/39* (2006.01)
(52) U.S. Cl. ................. 428/811.2; 360/324.12; 257/421; 257/425
(58) Field of Classification Search .................. None
See application file for complete search history.

(56) References Cited

U.S. PATENT DOCUMENTS

| 5,695,864 | A | 12/1997 | Slonczewski |
| 5,883,725 | A | 3/1999 | Sawano |
| 6,603,677 | B2 | 8/2003 | Redon et al. |
| 6,963,500 | B2 * | 11/2005 | Tsang ........................... 365/171 |
| 6,980,469 | B2 * | 12/2005 | Kent et al. ..................... 365/171 |
| 7,558,028 | B2 * | 7/2009 | Carey et al. ............... 360/324.12 |
| 2005/0023938 | A1 * | 2/2005 | Sato et al. ..................... 310/363 |
| 2005/0219771 | A1 * | 10/2005 | Sato et al. .................. 360/324.2 |
| 2006/0141640 | A1 * | 6/2006 | Huai et al. ......................... 438/3 |

(Continued)

FOREIGN PATENT DOCUMENTS

FR 2 817 999 6/2002

(Continued)

OTHER PUBLICATIONS

Kiselev, S.I. et al., "*Microwave Oscillations of a Nanomagnet Driven by Spin-Polarized Current*," Nature, Nature Publishing Group, London, GB, vol. 425, Sep. 25, 2003, pp. 380-383.

(Continued)

*Primary Examiner* — Kevin Bernatz
(74) *Attorney, Agent, or Firm* — Burr & Brown

(57) ABSTRACT

This radio-frequency oscillator includes a magnetoresistive device in which a spin-polarized electric current flows. This device comprises a stack of at least a first so-called "anchored" magnetic layer having a fixed magnetization direction, a second magnetic layer, an amagnetic layer inserted between the above-mentioned two layers, intended to ensure magnetic decoupling of said layers. The oscillator also comprises means of causing a flow of electrons in said layers perpendicular to these layers and, if applicable, of applying an external magnetic field to the structure. The second magnetic layer has an excitation damping factor at least 10% greater than the damping measured in a simple layer of the same material having the same geometry for magnetic excitation having wavelengths equal to or less than the extent of the cone or cylinder of current that flows through the stack that constitutes the magnetoresistive device.

14 Claims, 3 Drawing Sheets

U.S. PATENT DOCUMENTS

2008/0019040 A1*  1/2008  Zhu et al. .................. 360/110
2008/0150643 A1*  6/2008  Suzuki et al. ............ 331/107 R
2009/0027810 A1*  1/2009  Horng et al. .............. 360/324.2

FOREIGN PATENT DOCUMENTS

WO         2005/064783 A2      7/2005

OTHER PUBLICATIONS

Rippard, W.H. et al., "*Direct-Current Induced Dynamics in $Co_{90}Fe_{10}/Ni_{80}Fe_{20}$ Point Contacts*," Physical Review Letters, New York, NY, vol. 92, No. 2, Jan. 15, 2004, pp. 027201-1 to 027204-4.

Baibich, M.N. et al., "*Giant Magnetoresistance of (001)Fe/(001)Cr Magnetic Superlattices*," Physical Review Letters, vol. 61, No. 21, Nov. 21, 1988, pp. 2472-2475.

Moodera, J.S. et al., "*Large Magnetoresistance at Room Temperature in Ferromagnetic Thin Film Tunnel Junctions*," Physical Review Letters, vol. 74, No. 16, Apr. 17, 1995, pp. 3273-3276.

Katine, J.A. et al., "*Current-Driven Magnetization Reversal and Spin-Wave Excitations in Co/Cu/Co Pillars*," Physical Review Letters, vol. 84, No. 14, Apr. 3, 2000, pp. 3149-3152.

Valet, T. et al., "*Theory of the Perpendicular Magnetoresistance in Magnetic Multilayers*," Physical Review B, vol. 48, No. 10, Sep. 1, 1993, pp. 7099-7113.

Russek, Stephen E., "Magnetostriction and Angular Dependence of Ferromagnetic Resonance Linewidth in Tb-doped $Ni_{0.8}Fe_{0.2}$ Thin Films", Journal of Applied Physics, vol. 91, No. 10, May 15, 2002, pp. 8659-8661.

Slonczewski, J.C., "Current-driven Excitation of Magnetic Multilayers", Journal of Magnetism and Magnetic Materials, 159 (1996) L1-L7.

Slonczewski, J.C., "Excitation of Spin Waves by an Electric Current", Journal of Magnetism and Magnetic Materials, 195 (1999) L261-L268.

\* cited by examiner

RADIO-FREQUENCY OSCILLATOR WITH SPIN-POLARISED CURRENT

CROSS REFERENCE TO RELATED APPLICATIONS

This application is a continuation of International Application No. PCT/IB2006/054692, filed Oct. 31, 2006, and claims the benefit under 35 USC 119(a)-(d) of French Application No. 05.53321, filed Nov. 2, 2005, the entireties of which are incorporated herein by reference.

FIELD OF THE INVENTION

The present invention relates to the field of radio-frequency oscillators that can operate in the substantially GHz or slightly sub GHz to several dozen GHz frequency spectrum using magnetic thin-film system technology. The invention has a particular application in the field of telecommunications, especially mobile communications.

BACKGROUND OF THE INVENTION

Spectacular growth in mobile phones (cell phones, portable phones) during recent years has encouraged professionals in this field to continue offering ever more new products and services. More especially, the arrival of multimedia has inspired these professionals to integrate numerous applications into mobile phones. These new applications require multiple connectivity to the cellular network besides connectivity to Wireless Personal Area Networks (WPAN), Bluetooth is one example of this technology which has been used as a basis for a new standard—IEEE 802.15.

This being so, consequently and in order to comply with the various standards, the electronics of these new products must be capable of operating over an extremely wide range of frequency bands. By way of example, the following different ranges of frequency bands are encountered among those used in telecommunications:

| Band | Frequency |
| --- | --- |
| GSM/GPRS/EDGE | 850 MHz, 900 MHz, 1.8 GHz, 1.9 GHz |
| WCDMA | 2 GHz |
| 802.11 a/g | 2.4 GHz and 5 GHz |
| GPS | 1.6 GHz |
| UWB | 3 to 7 GHz |
| RFID | 2.45 GHz |

W-CDMA: Wideband Code-Division Multiple Access
GPS: Global Positioning System
UWB: Ultra Wide Band
802.11 a/g: System for wireless networking
RFID: Radio-frequency Identification (especially labels).

As is known, the electrical performance of receivers both in terms of sensitivity and selectivity is chiefly dictated by the frequency synthesiser, i.e. the device in radio-frequency sensors that is used to generate the carrier frequency of the signal. To cover the various frequency ranges mentioned above, multi-standard, multiband devices need to use a large number of radio-frequency oscillators.

Known oscillators include LC resonators which have a quality coefficient or quality factor $Q=f/\Box f$ that is relatively low (4 to 10 in the frequency band in question). Oscillators made using such a resonator have average performance, especially in terms of spectral purity (phase jitter). In addition, frequency tunability is obtained with the aid of a variable MOS type capacitance (C) and is low, since the frequency variation that can be obtained is of the order of 20% of the carrier frequency value.

Not only this, the frequency bands allocated to telecommunications are becoming increasingly saturated, thus compromising a static allocation concept for said bands. To solve this saturation problem, one solution is to make use of dynamic frequency allocation. This principle relies on the ability to analyse the frequency spectrum and, as far as application to 1 GHz to 10 GHz telecommunications is concerned, to identify unoccupied frequency bands in order to be able to use them. This is referred to as a "radio-opportunistic" system.

However, in order to use this dynamic frequency allocation principle, the devices in question, in this case mobile phones, must have extremely wideband oscillators and offer extremely good performance in terms of phase jitter, and hence a high quality factor. This requirement effectively rules out LC-resonator-based oscillators which would involve using complex, expensive architecture.

One technical solution capable of meeting these requirements can be to use spintronic radio-frequency oscillators. Thus, using such oscillators, it is possible to obtain a wide frequency band with a high quality factor Q and straightforward frequency tunability and, moreover, to use a relatively simple architecture.

Spin electronics uses the spin of electrons as an additional degree of freedom in order to generate new effects.

Spin polarisation of an electric current is a result of asymmetry between the diffusion of "spin-up" type conduction electrons (i.e. parallel to local magnetisation) and that of "spin-down" type conduction electrons (i.e. antiparallel to local magnetisation). This asymmetry results in asymmetrical conductivity between the two spin-up and spin-down channels, and hence net spin polarisation of the current.

This spin polarisation of current causes magnetoresistive phenomena in magnetic multilayers such as giant magnetoresistance (Baibich, M., Broto, J. M., Fert, A., Nguyen Van Dau, F., Petroff, F., Etienne, P., Creuzet, G., Friederch, A. and Chazelas, J., "*Giant magnetoresistance of* (001)*Fe*/(001)*Cr magnetic superlattices*", Physical Review Letters, Vol. 61 (1988), 2472-5), or tunnel magnetoresistance (Moodera, J. S., Kinder, L. R., Wong, T. M. and Meservey, R., "*Large magnetoresistance at room temperature in ferromagnetic thin film tunnel junctions*", Physical Review Letters, Vol. 74 (1995), 3273-6).

In addition, it has also been observed that passing a spin-polarised current through a magnetic thin film can induce reversal of its magnetisation in the absence of any external magnetic field (Katine, J. A., Albert, F. J., Buhrman, R. A., Myers, E. B., and Ralph, D. C., "*Current-Driven Magnetization Reversal and Spin-Wave Excitations in Co/Cu/Co Pillars*", Physical Review Letters, Vol. 84 (2000), 3149-52).

The polarised current may also generate sustained magnetic excitation, also referred to as "oscillations" (Kiselev, S. I., Sankey, J. C., Krivorotov, I. N., Emley, N. C., Schoekopf, R. J., Buhrman, R. A., and Ralph, D. C., "*Microwave oscillations of a nanomagnet driven by a spin-polarized current*", Nature, Vol. 425 (2003), 380-3).

Using the effect of generating sustained magnetic excitation in a magnetoresistive device makes it possible to convert this effect into electrical resistance modulation that can be directly used in electronic circuits and hence, consequently, is capable of acting directly at the level of frequency.

U.S. Pat. No. 5,695,864 describes various developments that use the physical principle mentioned above. It describes, in particular, precession of the magnetisation of a magnetic layer through which a spin-polarised electric current flows.

The physical principle used will be described below in detail in relation to FIG. 1. In the context of a three-layer magnetic structure, two magnetic layers (1 and 2) are separated by a non-magnetic layer (3) (the term "non-magnetic" is taken to mean diamagnetic or paramagnetic). This intermediate layer (3) is also called a "spacer". Its thickness is sufficiently small to enable it to transmit a spin-polarised current and sufficiently large to ensure magnetic decoupling between layers (1 and 2) which it separates.

Layer (1) is a so-called "anchored" ferromagnetic layer in the sense that it has a fixed magnetisation direction. Generally speaking, this layer (1) is coupled to an antiferromagnetic layer, the function of which is to anchor said layer (1) so that its magnetisation does not flip when the assembly is subjected to an electric current. This layer (1) may also be made up of several layers as, for example, described in U.S. Pat. No. 5,883,725, in order to build a so-called "synthetic antiferromagnetic" layer. This layer (1) is called the "polariser". In fact, because of its fixed magnetisation direction, it induces spin polarisation of the electric current that flows through it. As already stated, in a magnetic material, the conductivity of elections that have spin parallel to the local magnetisation (spin-up) is different to that of electrons that have opposite spin (spin-down). Thus, reflection and transmission at the interface between the two layers having different magnetic properties are phenomena that depend on spin. The conduction electrons that reach the interface between layer (1) and spacer (3) mostly have a spin type (up or down) that depends on the nature of the materials used.

For layer (1) (polariser), one selects either a ferromagnetic layer of sufficient thickness to ensure maximum polarisation of the current or a "synthetic antiferromagnetic" (SAF) layer of appropriate thickness to achieve this same objective. With a transport geometry that is perpendicular to the plane of the layers, it is known that the characteristic length is the so-called spin diffusion length (Valet, T. and Fert, A., "*Theory of perpendicular magnetoresistance in magnetic multilayers*", Physical Review B, Vol. 48 (1993), 7099-7113). The term "sufficient thickness", in respect of the polarisation layer, is therefore taken to mean a thickness that is sufficiently large relative to this spin diffusion length (typically 5 nm in $Ni_{80}Fe_{20}$ at ambient temperature). Obviously, the polarisation layer may consist of one or more layers (for example a NiFe/CoFe bilayer or a multilayer laminated composite (CoFe1 nm/Cu0.3 nM)$_3$/CoFe1 nm) in order to encourage polarisation of the current or shorten the spin diffusion length.

If the thickness of spacer (3) is sufficiently small, polarisation of the electric current that flows through the layers at right angles is almost entirely preserved until it reaches the interface between spacer (3) and layer (2). This layer (2) is a magnetically soft so-called "free" layer, e.g. the direction of its magnetisation can easily be changed by the effect of a weak external field (typically a layer made of $Ni_{80}Fe_{20}$ Permalloy or CoFe alloys or formed by associating two layers such as NiFe/CoFe).

At the level of the interface between layer (2) and layer (3), spin transfer occurs between the spin-polarised current and the magnetic moment of layer (2). If the latter and the spin polarisation direction (imparted by the magnetisation of layer (1)) are not collinear, the current affects the magnetisation of layer (2) enough to make it rotate (precession). The sign of the spin transfer torque depends on the direction of the applied current:

If the conduction electrons move from polariser (1) to layer (2), the spin transfer torque will orientate the magnetisation of said layer (2) parallel to that of layer (1);

In contrast, if the conduction electrons move from layer (2) to polariser (1), said torque will orientate the magnetisation of layer (2) antiparallel to that of layer (1).

It has been demonstrated that, depending on the amplitude of the current or even the external magnetic field applied, two distinct effects can be detected:

Firstly, reversal of the magnetisation of layer (2); this reversal may be hysteretic or reversible, depending on the amplitude of the current or even the external magnetic field; this phenomenon can also be used as a means of writing information in the context of producing random-access memories, also referred to as MRAMs;

Also excitation of the sustained precession states of the magnetic moment of layer (2): this is the effect that is exploited within the framework of the present invention.

When one considers the sustained precession of the magnetic moment of layer (2), several modes have been revealed by microwave frequency measurements, depending on the relative intensity of the applied electric current in particular:

mode A: small-angle precession of the ferromagnetic resonance (FMR) type: this precession mode occurs for relatively weak intensity currents and is characterised by signals having a given frequency that does not depend on the applied current;

mode B: large-angle precession: this precession mode occurs if the applied current is increased above a certain threshold and is characterised by marked frequency dependence on the applied current;

mode C: microwave RTS noise for medium-intensity currents besides weak magnetic fields. The spectra measured under these conditions show very wide, very high-amplitude peaks centred around 1 GHz.

In the context of the present invention, the behaviours exploited are those for which the precession frequency can be adjusted, either by influencing the current or, preferably, by influencing both the current and the external magnetic field. Such structures on nanostructures are integrated in magnetoresistive assemblies or devices. In the case of both giant magnetoresistance (GMR) in metallic systems or tunnel magnetoresistance (TMR) in metal-insulator-magnetic-metal tunnel junctions, magnetisation precession results in variation of the electrical resistance measured when a current is applied in a direction that is perpendicular to the plane of the layers (CCP or Current Perpendicular to Plane geometry).

Without going into details that are deemed to be known by those skilled in the art, magnetic tunnel junctions referred to as TMRs or MTJs, at their simplest, consist of two magnetic layers, it being possible to vary the relative orientation of their magnetisation and the layers being separated by an insulating layer.

The magnetoresistive devices used employ stacks made in two different ways:

so-called "point contact" stacks in which the active layers (layer 1, layer 2, layer 3) are not etched using nanometric patterns, or if they are, are then fabricated using very large patterns (roughly $\mu m^2$); an extremely narrow metallic contact, typically 50 nm above layer (2), is produced by means of an external nanotip (for example tip of an atomic force microscope) or internal nanotip (screen printed pillar).

"pillar" type stacks: all the layers are etched to fabricate a pillar having a diameter of the order of 100 nm; in order to prevent the occurrence of significant magnetostatic interaction between layers (1) and (2), layer (1) is sometimes left unetched.

When current is passed through the first type of device perpendicular to the plane of the layers, the current lines all converge towards the nanocontact (the point contact) and diverge towards the inside of the stack in a cone, the shape of which depends on the electrical resistivity of the various layers. In the second case, with a pillar geometry, the current flows more or less uniformly over the entire cross-section of the pillar.

It has been demonstrated, with the aid of micromagnetic simulations, that the so-called "point contact" method is more advantageous for fabricating radio-frequency oscillators insofar as it minimises the occurrence of incoherent excitation produced by edge effects. FIG. 2 (pillar) and FIG. 3 (point contact) show these two types of stacks.

In relation to these structures, FR 2 817 999 states that when the polariser (layer 1) is magnetised in a direction that is perpendicular to the plane of the layers that make up the magnetoresistive device, and the moment of layer (2) is oriented in a direction parallel to the interfaces, the critical current required to induce precession of said magnetisation can be reduced.

Although, at a theoretical level, the magnetoresistive devices thus described make it possible to achieve implementation of radio-frequency oscillators that satisfy industrial manufacturing requirements (wide frequency range, dynamic frequency allocation is possible, high quality factor Q), it is nevertheless apparent that the actual quality of these devices depends on the consistency of the magnetisation precession produced by the electric current that flows through the layers.

The term "consistency of magnetisation precession" denotes the fact that magnetisation is moved as a single unit over the entire extent of the current sheet through the structure (i.e. over the cross-section of the pillar with a pillar geometry and over the cross-section of the current cone at the level of the free layer if there is a nanocontact) in contrast to producing multiple small excitations that are inconsistent.

Thus, greater consistency results in oscillation signals of narrower frequency and lower amplitude: it is the object of this invention to propose means of increasing the consistency of the dynamic movement of magnetisation precession. Because a reduction in amplitude is not the sought-after effect, once frequency narrowness has been obtained, attempts will be made to boost the amplitude.

SUMMARY OF THE INVENTION

The invention therefore relates to a radio-frequency oscillator that includes a magnetoresistive device in which a spin-polarised electric current flows, said device comprising a stack of at least:

a first so-called "anchored" magnetic layer having a fixed magnetisation direction, a second magnetic layer, an amagnetic layer inserted between the above-mentioned two layers, intended to ensure magnetic decoupling of said layers; and means of causing a flow of electrons in said layers perpendicular to these layers and, if applicable, of applying an external magnetic field to the structure.

According to the invention, the second magnetic layer has a high excitation damping factor (at least 10% greater than the damping measured in a simple layer of the same material having the same geometry) for magnetic excitation having wavelengths equal to or less than the extent of the cone or cylinder of current that flows through the stack that constitutes the magnetoresistive device.

In the rest of this description, for the sake of brevity, the excitation damping factor, also referred to as the "Gilbert damping factor" will be referred to simply as "damping".

In other words, said second magnetic layer is chosen so that when it is subjected to a spin-polarised electric current by the anchored layer and, if applicable, to an applied external magnetic field, its magnetisation precesses in a consistent, sustained manner.

Expressed differently, the object of the invention is to induce precession of the magnetisation of said second layer, also referred to as the "free layer" due to the effect of the spin-polarised current from the anchored layer that acts as a polariser, with precession dynamics that are as consistent as possible, i.e. the magnetisation behaves like a single object that rotates as a unit, rather than as the result of small random excitations that locally disorganise magnetisation. In absolute terms, the aim is to ensure that magnetisation remains as single-domain as possible (macrospin).

This being so, the magnetisation dynamics of said second layer are more consistent than those of a simple layer, for example one made of cobalt, nickel or iron or of an alloy of these two metals, having the same geometry, same magnetisation configuration and subjected to spin current under the same conditions and, if applicable, to an external magnetic field.

Various methods are used to obtain significant damping of the second magnetic layer for magnetic excitation having a wavelength equal to or less than the extent of the cone or cylinder that passes through the stack that constitutes the magnetoresistive device. Any means making it possible to increase the excitation damping factor in the proportions mentioned above can be used in order to implement the invention. The three main means are described below.

According to a first embodiment of the invention, this damping is obtained by associating an antiferromagnetic layer with said second layer, this AFM layer being located on the surface of said layer opposite the spacer or paramagnetic layer. Such coupling increases the Gilbert damping. In addition, the restoring force exerted by ferromagnetic/antiferromagnetic coupling encourages consistent dynamic magnetisation movement. Typically, this antiferromagnetic layer can consist of $Ir_{20}Mn_{80}$, having a thickness of 3 to 10 nm, or be made of FeMn having a typical thickness of 5 to 12 nm, or PtMn having a typical thickness of 8 to 30 nm.

Advantageously, this antiferromagnetic layer is a metallic, non-oxide based layer in order not to impair the series resistance of the pillar that is part of the stacked layers excessively.

According to a second embodiment of the invention, this damping is obtained by using, for said second layer, a material with a high exchange stiffness constant. In fact, because exchange interaction forces spins to remain parallel to each other, it is difficult for short-wavelength excitation to develop. Thus, damping of short-wavelength excitation is increased relative to the damping that would have been obtained for a layer having a lower exchange constant. There is a certain correlation between this constant, more commonly referred to as the "exchange stiffness", and the Curie temperature. One preferably chooses materials that are rich in cobalt (for example CoFe alloys) and well known for their high Curie temperature.

Also, one can improve the consistency of precession by using magnetic materials with a low magnetic moment (for example CoFeB alloys incorporating 10 to 20% of boron are preferable to CoFe alloys with a higher moment) which have the advantage of minimising the effects of magnetic non-uniformity associated with the strong demagnetising field that is present at the edges of the device.

According to a third embodiment of the invention, this damping is increased by adding various lanthanide-series impurities to said second magnetic layer. By way of example, these impurities may consist of terbium in low proportions, typically from 0.01% to 2% (atomic percentage).

According to the invention, said first and second magnetic layers are anchored in optimised directions that may be located in or outside the plane of the layers. The direction is optimised so that the amplitude of the precession movement is as large as possible in order to produce an RF signal having the largest possible amplitude. This optimisation can be guided, for instance, by dynamic macrospin modelling based on the Landau Lifshitz Gilbert equation with the inclusion of Slonczewski's spin transfer term, and then be adjusted experimentally.

According to another embodiment of the invention that is similar to the second above-mentioned embodiment, said second magnetic layer, the magnetisation of which precesses, is not coupled to an adjacent antiferromagnetic layer but is associated firstly with a second amagnetic layer on the interface opposite to that with the first amagnetic layer and then secondly, on the other side of this second layer, associated with a polarising layer, the function of which is similar to that of the first polarising layer. This being so, the magnetisation of said second magnetic layer is subjected to the spin transfer effects of the two polarising layers and this makes it possible to increase the effectiveness of the phenomenon that causes the magnetisation to precess.

The magnetisation direction of the two polarising layers is not, generally speaking, the same and may even be substantially antiparallel or orthogonal (one polarising layer is magnetised substantially in one plane and the other layer is outside this plane).

The invention makes it possible to achieve extremely consistent precession of the magnetisation of layer (2) with quality factors in excess of 10,000 and, potentially, in excess of 20,000.

BRIEF DESCRIPTION OF THE DRAWINGS

The way in which the invention is implemented and its resulting advantages will be made more readily understandable by the descriptions of the following embodiments, given merely by way of example, reference being made to the accompanying drawings.

FIG. 6a shows an excitation spectrum for various currents flowing through the structure, the excited layer being a simple CoFe layer according to the prior art. FIG. 6b shows the improvement in the fineness of the excitation lines due to the effect of the current when this same CoFe layer is moderately anchored by an IrMn antiferromagnetic layer. FIG. 6b also shows the tunability of the excitation line as a function of the current flowing through the structure.

DETAILED DESCRIPTION OF THE INVENTION

Figure 1:
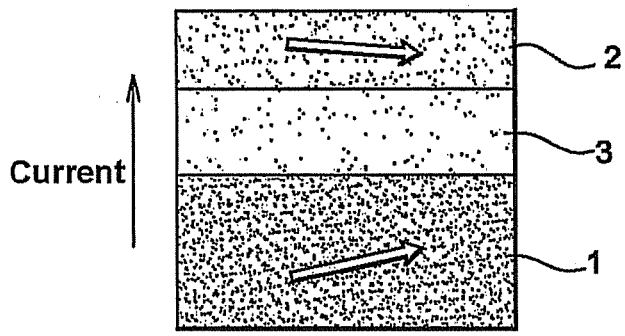
FIG. 1 is a schematic diagram showing the stacked layers of a magnetoresistive device according to the prior art.
Figure 2:
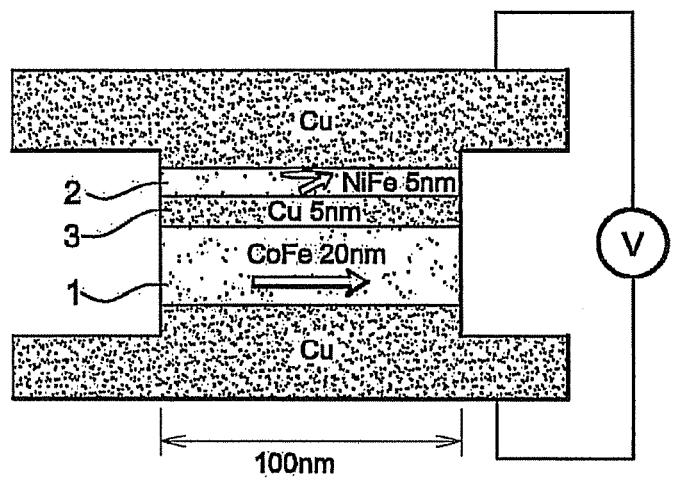
FIGS. 2 and 3 show different types of stacking of these layers.
Figure 3:
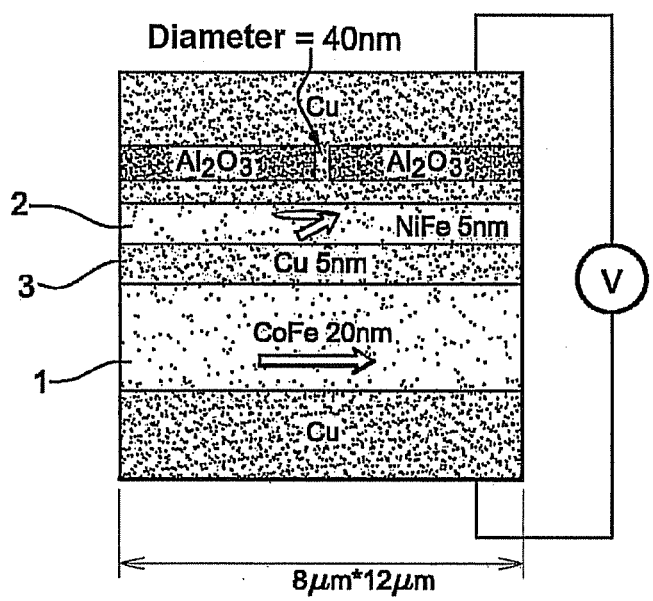

To produce the radio-frequency oscillator in accordance with the invention, one uses a magnetoresistive device consisting of a stack of the same type as those described in relation to FIGS. 2 and 3. This stack is inserted between two current leads, the contact thereof with the two extreme layers of said stack being made of copper or gold.

The geometry of this stack will be characterised, in particular, by its width or by its diameter if it is cylindrical.

Layer (1) of this so-called "anchored layer" stack has a fixed magnetisation direction. This layer (1) can be a simple, relatively thick (of the order of 100 nm) layer made of cobalt or a CoFe or NiFe alloy, for example. The thickness of this layer must be of the same magnitude or in excess of the spin diffusion length of the material of which this layer is made. In order to reduce this spin diffusion length, this layer may also be laminated by inserting several (typically 2 to 4) extremely fine layers of copper, silver or gold having a thickness of the order of 0.2 to 0.5 nm. These inserted layers are sufficiently fine to ensure strong exchange coupling throughout the laminated layer so that anchoring of this layer remains strong.

Figure 4:
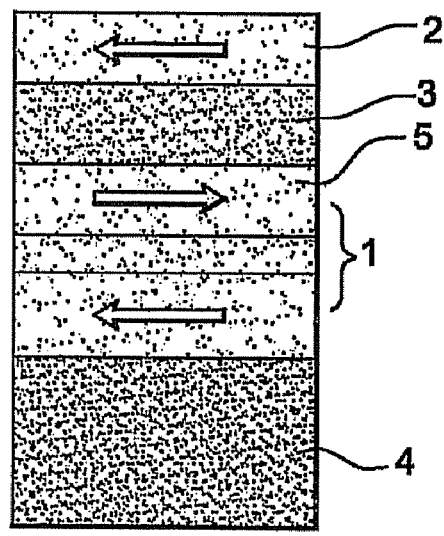
FIGS. 4 and 5 schematically show two embodiments of the invention.
Figure 5:
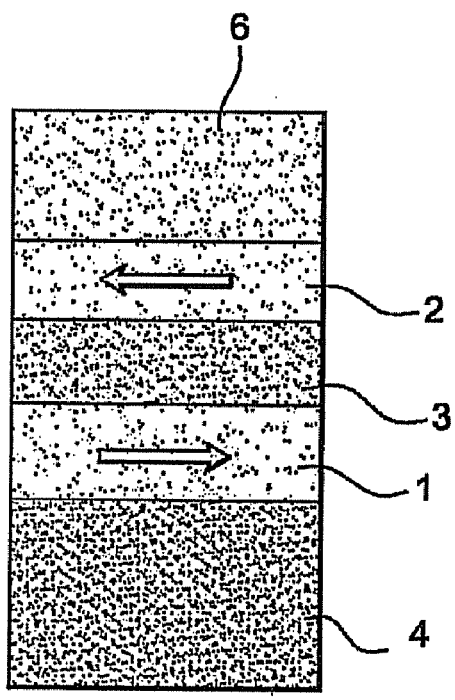

The typical composition of such a laminated anchored layer can be (CoFe1 nm/Cu0.3 nm)$_3$/CoFe1 nm. But it may also consist of a synthetic antiferromagnetic (SAF) layer of the CoFe3 nm/Ru0.7 nm/CoFe2.5 nm type. The selected Ru thickness is typically from 0.6 nm to 1 nm in order to ensure strong antiferromagnetic coupling between the two layers of CoFe. Once again, of the two layers that make up this SAF layer, at least the CoFe layer that will be closest to the free layer can be laminated by inserting fine layers of Cu in order to reduce its spin diffusion length. In addition, in both these configurations, the simple layer and the SAF layer can be anchored by exchange with an antiferromagnetic layer (4) (see FIGS. 4 and 5). This antiferromagnetic layer can be made of $Ir_{20}Mn_{80}$ having a thickness of 6 to 10 nm or $Pt_{50}Mn_{50}$ having a thickness of 15 to 30 nm. This layer (1) basically fulfils a polariser function. Thus, the electrical current electrons that flow through the layers that constitute the magnetoresistive device perpendicular to their plane and are reflected or transmitted by the polariser are polarised with a spin direction that is parallel to the magnetisation both on layer (1) and on the interface opposite to that which is in contact with antiferromagnetic layer (4).

Regardless whether it is simple (FIG. 5) or synthetic (FIG. 4), this layer (1) receives, on its surface that is opposite to that which receives antiferromagnetic layer (4), another layer (3) that functions as a spacer. This layer is metallic (typically a 5 nm to 10 nm thick layer of copper) or consists of a fine insulating layer of the aluminium oxide type (alumina $Al_2O_3$), typically 0.5 to 1.5 nm thick, or of the magnesium oxide type (MgO), typically 0.5 to 3 nm thick.

Finally, the nature of layer (2) may vary. The thickness of this layer (2) is, generally speaking, less than that of layer (1).

It may firstly consist of a simple magnetic layer having a thickness comparable to that of reference layer (5) of the synthetic antiferromagnetic structure of anchored layer (1).

According to a first embodiment (FIG. 5), this layer (2) is coupled with an antiferromagnetic layer (6) separately mounted on the latter on its surface opposite to the interface between layer (2) and spacer (3). This antiferromagnetic layer may also be made of a material selected from the group comprising $Ir_{20}Mn_{80}$, FeMn and PtMn. This antiferromagnetic layer will alter the relative freedom of the magnetisation of layer (2). However, by varying the thickness of this antiferromagnetic layer or by introducing an ultra fine layer of non-magnetic materials such as Cu or Pt (of the order of 0.1 to 0.5 nm thick along the interface between layers (2) and (6)), one can thereby ensure that the coupling produced is weaker than that of anchored layer or polariser (1), so that the magnetisation of layer (2) nevertheless manages to precess and the decoupling inherent in antiferromagnetic layer (6) helps keep said magnetisation consistent.

Optimisation studies demonstrate that even signals that correspond to this precession have up to 10 times more power than those that correspond to the same layer without its associated antiferromagnetic layer. This increase in signal power is explained by improvement in the consistency of the magnetisation precession of layer (2) due to exchange interaction through the interface with the associated antiferromagnetic layer (6) (see FIG. 6). This exchange interaction exerts a uniform restoring force on the precessing magnetisation and, through the same consistency, encourages magnetisation precession movement. It has also been observed that the ferromagnetic/antiferromagnetic coupling results in increased Gilbert damping (an increase amounting to almost +10% to +400% of the blocking temperature of the antiferromagnetic layer) and this results in strong attenuation of magnetic excitation in the system, thus helping maintain good magnetisation consistency.

In another variant of the invention, doping in the form of lanthanide-series-based impurities, especially terbium, are introduced into layer (2) in a proportion of 0.01% to 2% (atomic percentage). It has been demonstrated that through such doping, one can increase the excitation damping factor, i.e. the "Gilbert damping factor" (Russek et al, "*Magnetostriction and angular dependence of ferromagnetic resonance linewidth in Tb-doped $Ni_{0.8}Fe_{0.2}$ thin films*," Journal of Applied Physics, Vol. 91 (2002), 8659). It is important to state that the Gilbert damping factor must not be increased too much because this would result in an excessive increase in the critical current that needs to be passed through the structure in order to generate sustained magnetisation precession movement. A compromise must therefore be struck—this typically corresponds to Gilbert damping from 0.01 to 0.05.

This moderate damping makes it possible to attenuate short-wavelength excitation, especially that having wavelengths shorter than the size of the magnetoresistive stack and which is undesirable because it disrupts precession consistency. This damping is nevertheless not too strong so as not to result in excessive values (in excess of $10^7$ A/cm$^2$) in order to generate consistent magnetisation precession movement.

Advantageously, besides incorporating such impurities, one can also, as in the first embodiment described above, associate layer (2) doped in this way with antiferromagnetic layer (6) described above. In this case, the latter not only ensures increased damping, it also encourages, as previously, precession consistency by creating a restoring force exerted on the magnetisation.

Advantageously, the material used for layer (2) has a high exchange stiffness constant. To achieve this, one uses 3d metals, more especially cobalt or cobalt-rich alloys. Those skilled in the art will also be aware that layer (2) may consist of a number of ferromagnetic layers that are in direct contact with each other such as, for example, (NiFe/CoFe) bilayers that are commonly used in spin valves.

Advantageously, one can also use magnetic materials with a low magnetic moment (for example, CoFeB alloys incorporating 10 to 20% of boron are preferable to CoFe alloys with a higher moment) which have the advantage of minimising the effects of magnetic non-uniformity associated with the strong demagnetising field that is present at the edges of the device.

In another variant of the invention, layer (2), instead of consisting of a simple ferromagnetic layer, may consist, like the anchored layer, of a synthetic antiferromagnetic (SAF) layer, i.e. two ferromagnetic layers that are strongly antiferromagnetically coupled through a 0.5 to 1 nm thick layer of ruthenium. This SAF layer (2) can, in turn, be moderately anchored by an antiferromagnetic layer.

In another variant of the invention, layer (2) can be anchored in any direction relative to the magnetisation of polariser (1) and relative to the plane of the layers, this direction being selected in order to optimise the amplitude of the precession movement of the free layer's magnetisation. This optimisation can be guided, for instance, by dynamic macrospin modelling based on the Landau Lifshitz Gilbert equation with the inclusion of Slonczewski's spin transfer term (Slonczewski, J. C., "*Currents and torques in metallic magnetic multilayers*", Journal of Magnetism and Magnetic Materials, Vol. 159 (1996), L1); "*Excitation of spin waves by an electric current*", Vol. 195 (1999), L261-L268), and then be adjusted experimentally. To obtain this optimisation, it may also be necessary to apply an additional external magnetic field to the structure. This field can then be produced, for example, by layers of permanent magnets positioned at appropriate locations around the pillar in the same way used, for instance, to generate a bias field in magnetoresistive read heads used to read information from computer hard disks.

Also, according to another variant of the invention, if said second magnetic layer, the magnetisation of which precesses (simple layer or SAF), is not coupled to an adjacent antiferromagnetic layer, one can associate it with a second amagnetic layer (second spacer) on the interface opposite that with the first amagnetic layer and then, on the other side of this second layer, associate it with a polarising layer, the function of which is similar to that of the first polarising layer. This second anchored layer serving as a second polariser can itself be simple or consist of a synthetic antiferromagnetic layer (SAF) and be coupled to an antiferromagnetic layer separately mounted on the opposite side of the interface between this second anchored layer and the second amagnetic spacer.

This being so, the magnetisation of said second magnetic layer is subjected to the spin transfer effects of the two polarising layers and this makes it possible to increase the effectiveness of the phenomenon that causes the magnetisation to precess. The magnetisation direction of the two polarising layers is not, generally speaking, the same and must be optimised depending on the nature of the layer whose magnetisation precesses. For example, if the layer whose magnetisation precesses is a simple doped layer, the magnetisation directions of the two polarising layers can be substantially antiparallel or orthogonal (one polarising layer is magnetised substantially in one plane and the other layer is magnetised outside this plane).

If the layer whose magnetisation precesses is an SAF layer, the magnetisation directions of the two polarising layers can be substantially parallel or orthogonal.

Figure 6A:
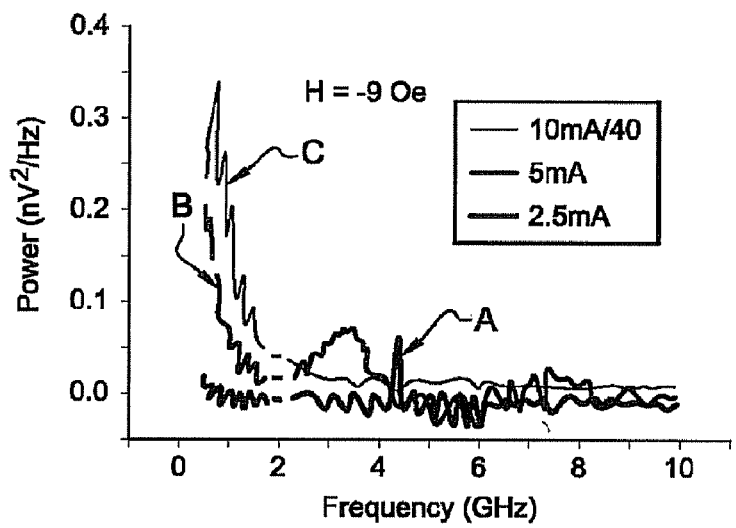
FIGS. 6a and 6b show the beneficial effect produced by the present invention on the excitation spectra of the structures that are the subject of this invention. Thus.
Figure 6B:
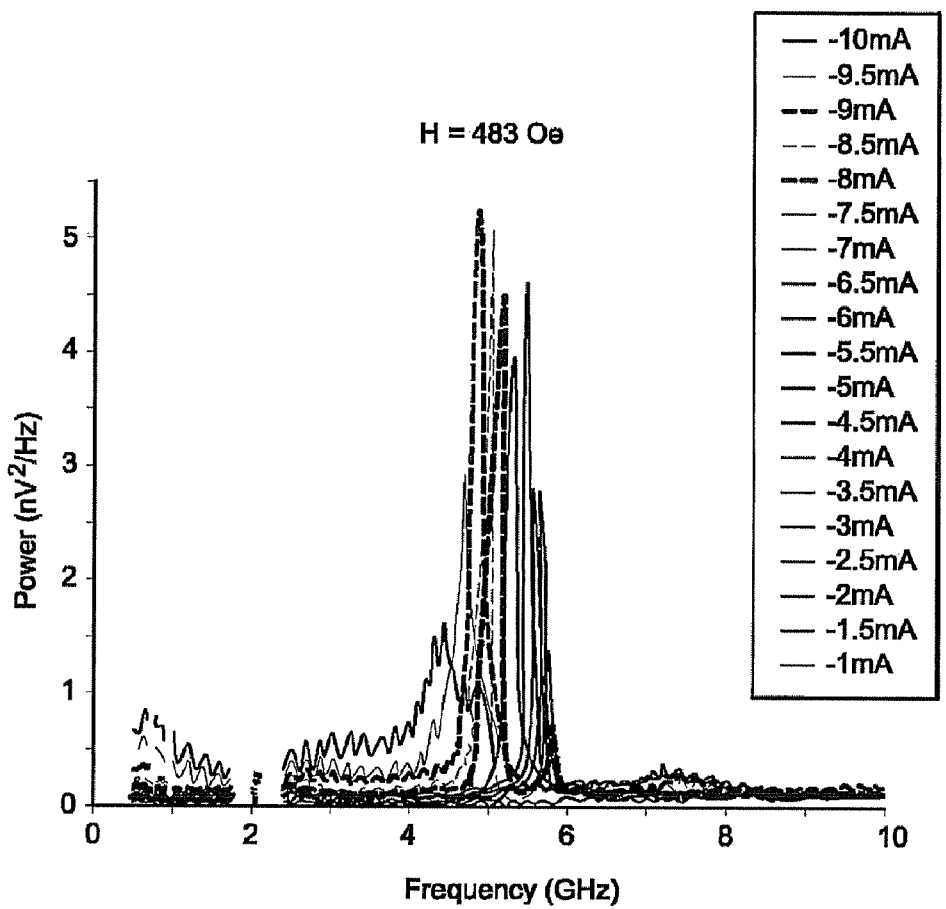

By way of example to illustrate the beneficial effect provided by the present invention on narrowness of the excitation lines (increase in quality factor), FIGS. 6a and 6b show excitation lines obtained for a structure based on the prior art and a structure according to the present invention. FIG. 6a shows an excitation spectrum for various currents flowing through the structure, the excited layer being a simple CoFe layer according to the prior art inserted into a device of the type shown in FIG. 4 comprising an anchored synthetic layer. FIG. 6b shows the very marked improvement in the fineness of the excitation lines due to the effect of the current when this same CoFe layer is moderately anchored by an IrMn antiferromagnetic layer. FIG. 6b also shows the tunability of the excitation line as a function of the current flowing through the structure.

What is claimed is:

1. A radio-frequency oscillator that includes a magnetoresistive device in which a spin-polarised electric current flows, said device comprising a stack of at least:
   a first magnetic layer that is an anchored layer having a fixed magnetisation direction that is oriented in the plane of the first magnetic layer;
   a second magnetic layer consisting of a synthetic antiferromagnetic layer;
   an amagnetic layer that is positioned between the first magnetic layer and the second magnetic layer that functions as a spacer and ensures magnetic decoupling of the first magnetic layer and the second magnetic layer; and
   means of causing a flow of electrons in said layers perpendicular to these layers and, if applicable, of applying an external magnetic field to the structure,
      wherein the second magnetic layer has a Gilbert damping factor at least 10% greater than the Gilbert damping factor measured in a simple layer of the same material having the same geometry for magnetic excitation having wavelengths equal to or less than the extent of the cone or cylinder of current that flows through the stack that constitutes the magnetoresistive device.

2. A radio-frequency oscillator as claimed in claim 1, wherein the material that constitutes at least one layer of the second magnetic layer is made of a Co rich alloy.

3. A radio-frequency oscillator as claimed in claim 1, wherein at least one layer of the second magnetic layer is made of magnetic materials having a magnetic moment less than that of CoFe alloys.

4. The radio-frequency oscillator of claim 3, wherein the second magnetic layer is a CoFe alloy having 10 to 20% Boron.

5. A radio-frequency oscillator as claimed in claim 1, wherein the second magnetic layer is doped with impurities from the group comprising lanthanide-series-based impurities and terbium-based impurities in proportions from 0.01% to 2% (atomic percentage).

6. A radio-frequency oscillator as claimed in claim 1, wherein the first "anchored" magnetic layer, functions as a polariser, consists of a simple layer, and the first magnetic layer is anchored by associating the first magnetic layer with an antiferromagnetic layer, that is mounted on a surface opposite the interface between the first magnetic layer and the amagnetic layer.

7. The radio-frequency oscillator of claim 6, wherein the antiferromagnetic layer is made of IrMn or PtMn.

8. A radio-frequency oscillator as claimed in claim 1, wherein the first magnetic layer functions as a polariser and consists of a synthetic antiferromagnetic layer.

9. A radio-frequency oscillator as claimed in claim 8, wherein an antiferromagnetic layer is separately mounted on the surface of said first magnetic layer opposite the interface between said layer and amagnetic layer.

10. A radio-frequency oscillator as claimed in claim 1, wherein said first and second magnetic layers are anchored in any direction located in the plane of the layers.

11. A radio-frequency oscillator as claimed in claim 1, wherein a second amagnetic layer constituting a second spacer is separately mounted on the surface opposite the interface between the second magnetic layer and the amagnetic layer and wherein a second anchored layer functioning as a second polariser is separately mounted on the interface of the second spacer which is opposite the interface with the second magnetic layer.

12. A radio-frequency oscillator as claimed in claim 11, wherein said second anchored layer is simple or consists of a synthetic antiferromagnetic (SAF) layer capable of being coupled with an antiferromagnetic layer separately mounted on the opposite side of the interface between the second anchored layer and the second spacer.

13. A radio-frequency oscillator as claimed in claim 1, wherein the stack that constitutes the magnetoresistive device is made by "point contact" whereby active layers are not etched with nanometric patterns and in that one uses a nanotip to produce a metallic contact of the order of maximum 50 nm above layer.

14. A radio-frequency oscillator as claimed in claim 1, wherein the stack that constitutes the magnetoresistive device is made as a "pillar", whereby the second magnetic layer and the amagnetic layer are at least etched in order to fabricate a pillar having a diameter of the order of 100 nm.

* * * * *